(12) United States Patent  
Syu et al.

(10) Patent No.: US 10,223,022 B2  
(45) Date of Patent: Mar. 5, 2019

(54) SYSTEM AND METHOD FOR IMPLEMENTING SUPER WORD LINE ZONES IN A MEMORY DEVICE

(71) Applicant: WESTERN DIGITAL TECHNOLOGIES, INC., Irvine, CA (US)

(72) Inventors: Meiman Lin Syu, Fremont, CA (US); Steven Sprouse, San Jose, CA (US); Kroum Stoev, Pleasanton, CA (US); Satish Vasudeva, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/418,455

(22) Filed: Jan. 27, 2017

(65) Prior Publication Data

US 2018/0217892 A1    Aug. 2, 2018

(51) Int. Cl.

| G06F 3/06 | (2006.01) |
|---|---|
| G06F 11/10 | (2006.01) |
| G11C 29/52 | (2006.01) |
| G11C 29/00 | (2006.01) |
| G11C 29/02 | (2006.01) |
| G11C 29/44 | (2006.01) |

(52) U.S. Cl.
CPC ............ *G06F 3/064* (2013.01); *G06F 11/104* (2013.01); *G06F 11/1016* (2013.01); *G06F 11/1072* (2013.01); *G11C 29/025* (2013.01); *G11C 29/44* (2013.01); *G11C 29/52* (2013.01); *G11C 29/883* (2013.01); *G06F 2212/7208* (2013.01)

(58) Field of Classification Search
CPC ..................... G06F 3/064; G06F 2212/7208
See application file for complete search history.

(56) References Cited

U.S. PATENT DOCUMENTS

| 8,572,311 | B1* | 10/2013 | Shalvi ..................... G06F 11/14 |
| | | | 711/103 |
| 9,146,875 | B1* | 9/2015 | Boyle ................. G06F 12/0866 |
| 9,875,049 | B2* | 1/2018 | Erez ...................... G06F 3/0625 |
| 2005/0144516 | A1* | 6/2005 | Gonzalez ............ G06F 12/0246 |
| | | | 714/6.13 |
| 2009/0089482 | A1* | 4/2009 | Traister ............... G06F 12/0246 |
| | | | 711/103 |
| 2010/0228940 | A1* | 9/2010 | Asnaashari ......... G06F 12/0246 |
| | | | 711/170 |

(Continued)

*Primary Examiner* — Steve N Nguyen  
(74) *Attorney, Agent, or Firm* — The Marbury Law Group PLLC

(57) ABSTRACT

A set of superblocks can be constructed by a memory controller employing good blocks and partially bad blocks in a plurality of memory access units. Each functional memory access unit among the plurality of memory access units contributes a single block that is a good block or a partially bad block to each superblock. The memory controller can further construct a set of super word line zones within each superblock in the set of superblocks. Each block within a superblock contributes a good word line zone to each super word line zone. Upon encounter of a program error at run time, the super word line zones within the superblock may be modified to continue running the program employing modified super word line zones for the superblock.

5 Claims, 10 Drawing Sheets

(56) References Cited

U.S. PATENT DOCUMENTS

| | | | |
|---|---|---|---|
| 2012/0047409 A1* | 2/2012 | Post | G06F 11/1048 714/718 |
| 2013/0205102 A1* | 8/2013 | Jones | G06F 12/0246 711/154 |
| 2015/0134885 A1* | 5/2015 | Yeung | G06F 12/0246 711/103 |
| 2016/0004464 A1* | 1/2016 | Shen | G06F 3/0619 711/103 |
| 2016/0077749 A1* | 3/2016 | Ravimohan | G06F 3/0617 711/103 |
| 2016/0299844 A1 | 10/2016 | Sprouse et al. | |
| 2017/0286286 A1* | 10/2017 | Szubbocsev | G06F 12/0246 |
| 2018/0018091 A1* | 1/2018 | Shin | G06F 3/061 |
| 2018/0032268 A1* | 2/2018 | Barndt | G06F 3/0616 |

* cited by examiner

SYSTEM AND METHOD FOR IMPLEMENTING SUPER WORD LINE ZONES IN A MEMORY DEVICE

FIELD

The present disclosure relates generally to the field of memory management and specifically to a data storage system configured to manage memory employing super word line zones and methods of operating the same.

BACKGROUND

Superblocks that include a set of blocks from different dies can be formed during operation to facilitate utilization of memory in a non-volatile memory device, such as a solid-state drive. A plurality of superblocks can be provided such that each superblock includes one good block from each die in the solid-state drive. Each superblock can function as a concurrent input/output (I/O) access unit, thereby enhancing performance of the non-volatile memory device.

One of the previous approaches for providing superblocks is to pick one good block from each plane or each die in the non-volatile memory device to form each superblock. In this approach, if the memory controller cannot locate one good block from each plane or die, then the memory controller is not capable of providing a superblock. In this approach, any block with less than full functionality is not usable for the purpose of building a superblock.

SUMMARY

According to an aspect of the present disclosure, a data storage system is provided, which comprises a memory controller that controls operation of a plurality of memory access units. The memory controller is configured to perform steps of: classifying each block within the plurality of memory access units into good blocks, partially bad blocks, and bad blocks, wherein good blocks include only good word line zones, each of the partially bad blocks includes at least one, and not more than N, bad word line zones, and each of the bad blocks including more than N bad word line zones, wherein N is a positive integer; and constructing a set of superblocks employing the good blocks and the partially bad blocks, wherein each functional memory access unit among the plurality of memory access units contributes a single block that is a good block or a partially bad block to each superblock within a predominant subset of the set of superblocks.

According to another aspect of the present disclosure, a method of operating a data storage system is provided. The data storage system comprises a memory controller that controls operation of a plurality of memory access units. The method comprises steps of: classifying, by employing the memory controller, each block within the plurality of memory access units into good blocks, partially bad blocks, and bad blocks, wherein good blocks include only good word line zones, each of the partially bad blocks includes at least one, and not more than N, bad word line zones, and each of the bad blocks including more than N bad word line zones, wherein N is a positive integer; and constructing, by employing the memory controller, a set of superblocks employing the good blocks and the partially bad blocks, wherein each functional memory access unit among the plurality of memory access units contributes a single block that is a good block or a partially bad block to each superblock within a predominant subset of the set of superblocks.

DETAILED DESCRIPTION

Figure 1:
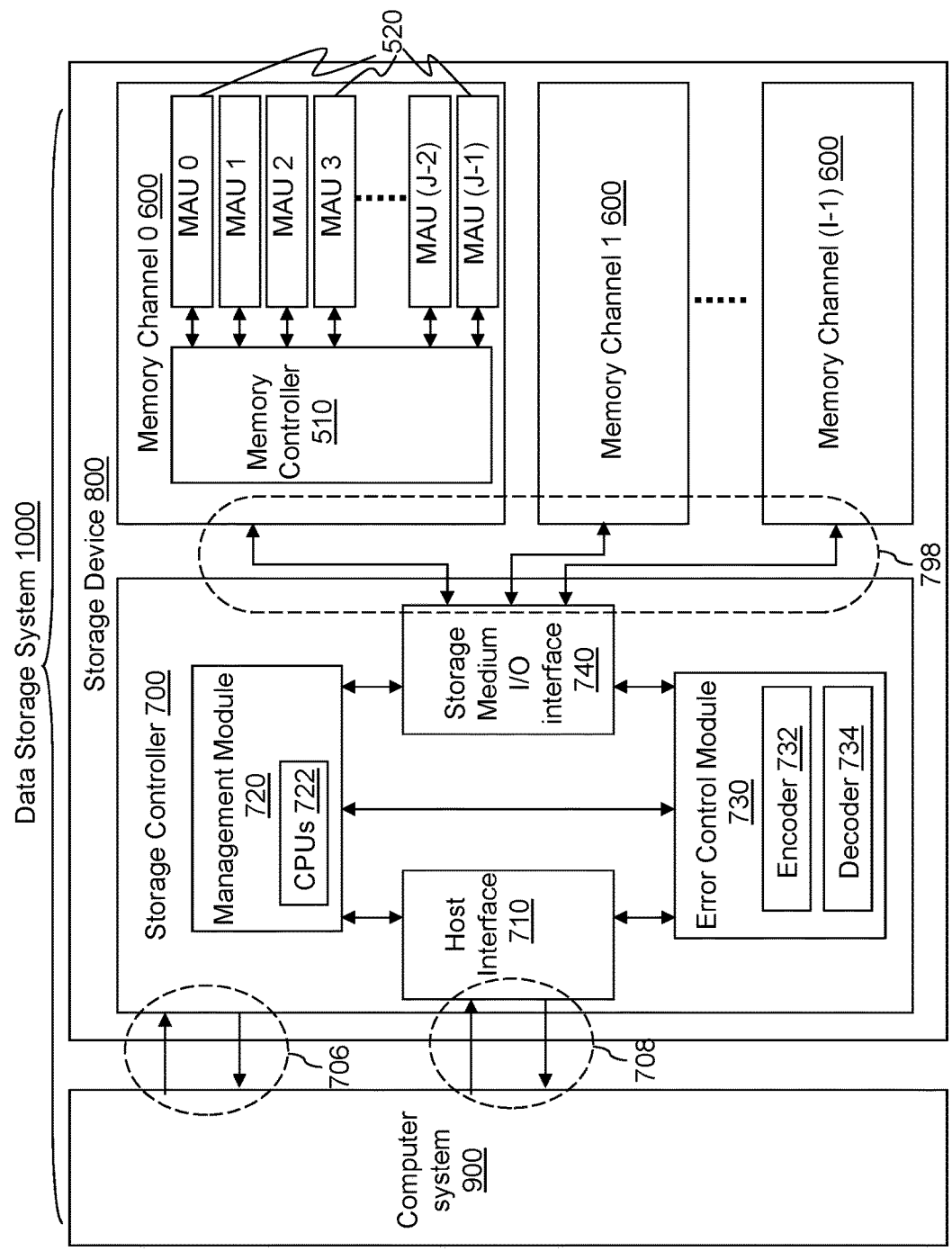
FIG. 1 is a block diagram of a non-limiting exemplary data storage system that may be employed to implement methods and systems according to embodiments of the present disclosure.

As discussed above, the present disclosure is directed to a data storage system configured to manage memory employing super word line zones and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

As used herein the term "data storage system" refers to any system provided with hardware and suitable software for operating the hardware and configured to store data therein and to retrieve data therefrom. A data storage system may, or may not, include a computer therein, and is configured to enable exchange of data with an internal computer or an external computer. The data storage system may, or may not, be incorporated within a computer or a computing system. The data storage system may, or may not, be a stand-alone unit that is configured to communicate with at least one external computer.

As used herein, a "computer" or a "computer system" includes any of the traditional desktop computers, mainframes, servers, as well as other computing devices (e.g., calculators, phones, watches, personal digital assistants, etc.). In some embodiments, the computer system comprises computer memory or a computer memory device and a computer processor. In some embodiments, the computer memory (or computer memory device) and computer processor are part of the same computer. In other embodiments, the computer memory device or computer memory is located on one computer and the computer processor is located on a different computer. In some embodiments, the computer memory is connected to the computer processor through the Internet or World Wide Web.

In some embodiments, the computer memory is on a computer readable medium (e.g., solid-state flash memory, floppy disk, hard disk, compact disk, etc). In other embodiments, the computer memory (or computer memory device) and computer processor are connected via a local network or intranet. In some embodiments, "a processor" may in fact comprise multiple processors in communication with each other for carrying out the various processing tasks required to reach the desired end result. For example, the computer of an intermediary service provider may perform some processing or information storage and the computer of a customer linked to the intermediary service provider may perform other processing or information storage.

As used herein, a "memory controller" refers to a broad class of generic and application-specific processing devices that are capable of reading data from, and writing data to, one or more memory modules.

As used herein, a "good" element refers to an element that is fully functional, i.e., an element that provides 100% of the functionality that the element is designed for. As used herein, a "partially bad" element refers to an element that provide functionality that is less than 100% of the functionality that the element is designed for, and provides at least a minimum level of functionality that is greater than 0% of the functionality that the element is designed for. As used herein, a "bad" element refers to an element that provides less than the minimum level of functionality used to define a "partially bad" element.

FIG. 1 is a block diagram of a non-limiting exemplary data storage system 1000 that may be employed to implement methods and systems according to embodiments of the present disclosure. The data storage system 1000 includes at least one storage device 800. In one embodiment, data storage system 1000 can contain more than one storage devices 800. The data storage system 1000 can further include, or can be used in conjunction with, a computer system 900, which is configured to communicate with the storage device 800. The storage device 800 includes a storage controller 700 and one or more memory channels 600. In one embodiment, the storage controller 700 may be a solid-state drive ("SSD") controller and the storage device 800 comprises a SSD. For example, a total of I memory channels 600 may be provided.

The total number I of memory channels 600 may be in a range from 1 to 4,096, and may be a non-negative integer power of 2 (such as 8, 16, or 32), although lesser and greater numbers may also be employed. Each of the memory channels 600 can include one or more memory access units 520 and a respective memory controller 510. Each memory controller 510 controls flow of data from a set of one or more memory access units 520 and a computer system 900 through a storage controller 700, which can be configured to direct data flow between the computer system 900 and each of a plurality of memory controllers 510.

In one embodiment, the storage device 800 can include memory access units 520. In one embodiment, each memory channel 600 can have a dedicated set of one or more memory access units 520. Each memory access unit ("MAU") 520 can include one or more non-volatile memory ("NVM") devices, such as flash memory devices, as a storage medium. Each memory access unit 520 within a memory channel 600 may include a single flash memory device such as a single integrated circuit (IC) die, a plurality of flash memory devices such as a plurality of IC dies, or a portion of a single IC die, such as a single plane of an IC die containing multiple planes (such as 2, 4, 8, etc.). In one embodiment, NAND-type flash memory access units or NOR-type flash memory access units may be employed as memory access units 520. In one embodiment, memory access units 520 include one or more three-dimensional (3D) memory devices, such as 3D NAND NVM devices. In one embodiment, a flash memory device may include one or more flash memory die, one or more flash memory packages, and/or one or more flash memory channels. Alternatively, other types of storage media may be employed (e.g., PCRAM, ReRAM, STT-RAM, etc.) to implement the various embodiments of the present disclosure.

Each memory access unit 520 is a unit for receiving control instructions from a memory controller 510. The total number J of memory access units (MAUs) 520 may be in a range from 1 to 18,384, and may be a positive power of 2 (such as 32, 64, 128, or 256), although lesser and greater numbers may also be employed.

The computer system 900 is coupled to storage controller 700 through data connections 708, and optionally through a control bus or connection 706. In one embodiment, the computer system 900 may include the storage controller 700, or at least one sub-unit of the storage controller 700, as a component and/or a subsystem. For example, in one embodiment, some or all of the functionality of storage controller 700 may be implemented by software executed on computer system 900. The computer system 900 may be any suitable computer device, such as a personal computer, a laptop computer, a tablet device, a mobile phone, a computer server, a mainframe, a supercomputer, or any other known computing device. The computer system 900 is may be referred to as a host, host system, client, or client system. In one embodiment, the computer system 900 may be a server system, such as a server system in a data center. Optionally, the computer system 900 can include one or more processors, one or more types of memory, a display and/or other peripheral devices known in the art.

In one embodiment, the storage device 800 includes memory controllers 510 (also known as "channel controllers" or "port controllers") that couple the storage controller 700 and the memory access units 520. In one embodiment, the storage device 800 can include I memory channels 600. Each memory channel 600 can include a respective memory controller 510 and a set of memory access units 520 that are coupled to the memory controller 510. In an alternative configuration, two or more memory channels 600 may share a memory controller 510.

Alternatively, the storage device 800 does not include any memory controllers 510. In this case, the storage controller 700 provides host command parsing and logical to physical address translation, manages the memory access units 520 in the memory channels 600, and distributes individual memory operations (e.g., read operations, write operations, and erase operations) commands to the memory access units 520. The total number of the memory access units 520 may be the same within each memory channel 600, or may be different among the memory channels 600.

The memory channels 600 can be coupled to the storage controller 700 through connections 798. The connections 798 can convey data, commands, and metadata, error correction information, and/or any other information to be stored in memory access units 520 and data values read from memory access units 520. In one embodiment, the storage controller 700 and the memory access units 520 may be contained in a same integral device as components thereof. In one embodiment, the storage controller 700 and the memory access units 520 may be embedded in a host device (such as the computer system 900), and the methods of the present disclosure may be performed, at least in part, by an embedded memory controller.

In one embodiment, flash memory devices can be employed as the memory access units 520. The flash memory devices can be configured for enterprise storage suitable for applications such as cloud computing, for database applications, primary and/or secondary storage, and/or for caching data for secondary storage devices (such as hard disk drives). Additionally and/or alternatively, the flash memory devices can be configured for relatively smaller-scale applications such as personal flash drives or hard-disk replacements for personal, laptop, and tablet computers.

The memory access units 520 are divided into a number of addressable and individually selectable blocks. As used herein, a "block" refers to a smallest unit of a memory array that can be individually selected for an erase operation. The individually selectable blocks are the minimum size erasable units in a flash memory device. In other words, each block contains the minimum number of memory cells that can be erased simultaneously. Each block is typically divided into a plurality of pages. In some embodiments, a page can be a smallest unit of a memory array that can be individually selected for a read operation. Typically, a block includes a plurality of pages. The number of pages in a block may be in a range from 64 to $2^{16}$, although lesser and greater numbers can also be employed. In some embodiments, the smallest individually accessible unit of a data set for a read operation may be smaller than a page, which is referred to as a "sector." Thus, a block can include a plurality of pages, each page can contain a plurality of sectors, and each sector is the minimum unit of data for reading data from the flash memory device.

In one embodiment, the storage controller 700 includes a management module 720, a host interface 710, a storage medium input/output (I/O) interface 740, and an error control module 730. The storage controller 700 may optionally include additional components known in the art.

The host interface 710 provides an interface to the computer system 900 through the data connections 708. The storage medium I/O interface 740 provides an interface to memory channels 600 and respective memory access units 520 though the connections 798. In one embodiment, the storage medium I/O 740 includes transmit and receive circuitry, which is a circuitry for providing read operation signals to the memory controllers 510 (such as reading threshold voltages for a NAND-type flash memory).

In one embodiment, the management module 720 includes one or more central processing units (CPUs) 722, i.e., processors, which are configured to execute program instructions. In one embodiment, the one or more CPUs 722 may be shared by one or more components within, and/or beyond, the storage controller 700. The management module 720 is coupled to the host interface 710, the error control module 730, and the storage medium I/O interface 740 in order to coordinate the operation of the components with the storage controller 700. In one embodiment, one or more components of the management module 720 may be implemented within a management module (not shown) of the computer system 900. In one embodiment, one or more processors (not shown) of the computer system 900 may be configured to execute program instructions in lieu of, or in addition to, the management module 720 of the storage controller 700.

The error control module 730 can be coupled to storage medium I/O interface 740, the host interface 710, and the management module 720. In an illustrative example, the error control module 730 may be employed to limit the number of uncorrectable errors inadvertently introduced into data during write operations into the memory access units 520 or during read operations from the memory access units 520. In one embodiment, the function of the error control module 730 may be performing by executing a dedicated program (i.e., by software) in one or more of the CPUs 722 in the management module 720. Additionally or alternatively, the error control module 730 can be implemented at least partly by a special purpose circuitry, which is a hardware configured to perform encoding and decoding functions. In one embodiment, the function of the error control module 730 may be implemented at least partly by executing a dedicated program on the computer system 900.

In one embodiment, the error control module 730 can includes an encoder 732 and a decoder 734. In one embodiment, the encoder 732 encodes data by applying an error control code to produce a codeword, which is subsequently stored in one or more memory access units 520 of the memory channels 600. Codewords produced by the encoder 732 can include both data (i.e., encoded data) and corresponding error correction bits (which are referred to as parity values, parity bits, or syndrome values). In one embodiment, the encoders 732 may be configured to produce codewords having a particular code rate (such as the ratio of data bits in a codeword to the size of the codeword) and a codeword structure (such as the bit length of the codeword and the location of the error correction bits within the codeword). When the encoded data (such as one or more codewords) is read from memory access units 520, the decoder 734 applies a decoding process to the encoded data to recover the data, and to correct errors in the recovered data within the error correcting capability of the error control code.

Types of error correction codes include, for example, Hamming, Reed-Solomon (RS), Bose Chaudhuri Hocquenghem (BCH), and low-density parity-check (LDPC). Algorithms may be utilized in the decoding of a number of different types or families of error control codes.

In one embodiment, the encoder 732 may be implemented as a plurality of encoders configured to encode data in accordance with one or more error correction formats (e.g., corresponding to a particular code rate, codeword structure, and error correction type, as described in greater detail below). Likewise, the decoder 734 may be implemented as a plurality of decoders configured to decode data in accordance with one or more error correction formats. Furthermore, in some implementations, each of the plurality of encoders and/or decoders may be configured to encode/decode data in accordance with distinct error correction formats.

The host interface 710 receives data to be stored in the memory access units 520 from the computer system 900 during a write operation. The data received by the host interface 710 is made available to the encoder 732, which encodes the data to produce one or more codewords. The one or more codewords are made available to the storage medium I/O interface 740, which transfers the one or more codewords to one or more memory channels 600 for storage in the memory access units 520.

In one embodiment, a read operation is initiated when the computer system 900 sends one or more host read commands through the data connections 708 (or alternatively through a separate control line or bus 706) to the storage controller 700, thereby requesting data from the memory access units 520. The storage controller 700 sends one or more read access commands to at least one of the memory access units 520 through the storage medium I/O interface 740, thereby requesting raw read data in accordance with the physical addresses (i.e., the memory locations) as specified (directly or indirectly) by the one or more host read commands. The storage medium I/O interface 740 provides the raw read data (which includes one or more codewords) to the decoder 734. If the decoding is successful, the decoded data is provided to the host interface 710, which makes the decoded data available to the computer system 900 by transmitting the decoded data through the data connections 708. In one embodiment, if the decoding is not successful, the storage controller 700 may resort to a number of remedial actions or provide an indication of an irresolvable error condition.

The memory access units 520 are divided into a number of addressable and individually selectable blocks. Each block is divided into a plurality of pages, word lines and/or sectors. While erasure of non-volatile memory devices is performed block by block, reading and programming of non-volatile memory devices can be performed on a smaller subunit of a block. In other words, the smaller subunit of a block can be the smallest selectable unit for a read operation or a program operation. For example, reading and programming of non-volatile memory device can be performed page by page, word line by word line and/or sector by sector. The smaller subunit of a block includes multiple memory cells, such as multi-level cells or single level cells. In one embodiment, programming may be performed on an entire page.

If data is written to non-volatile memory devices in pages, and the non-volatile memory devices are erased in blocks, pages that contain invalid (e.g., stale) data cannot be over-written until the entire block containing such pages is erased. In order to be able to write to the pages with invalid data, any page with valid data in such a block needs to be read and re-written to a new block before the old block can be erased or put into queue to be erased. This process is referred to as garbage collection. After garbage collection, the new block contains pages with valid data saved through the data transfer, and may have free pages. The old block can then be erased so as to be available for data storage.

Figure 2:
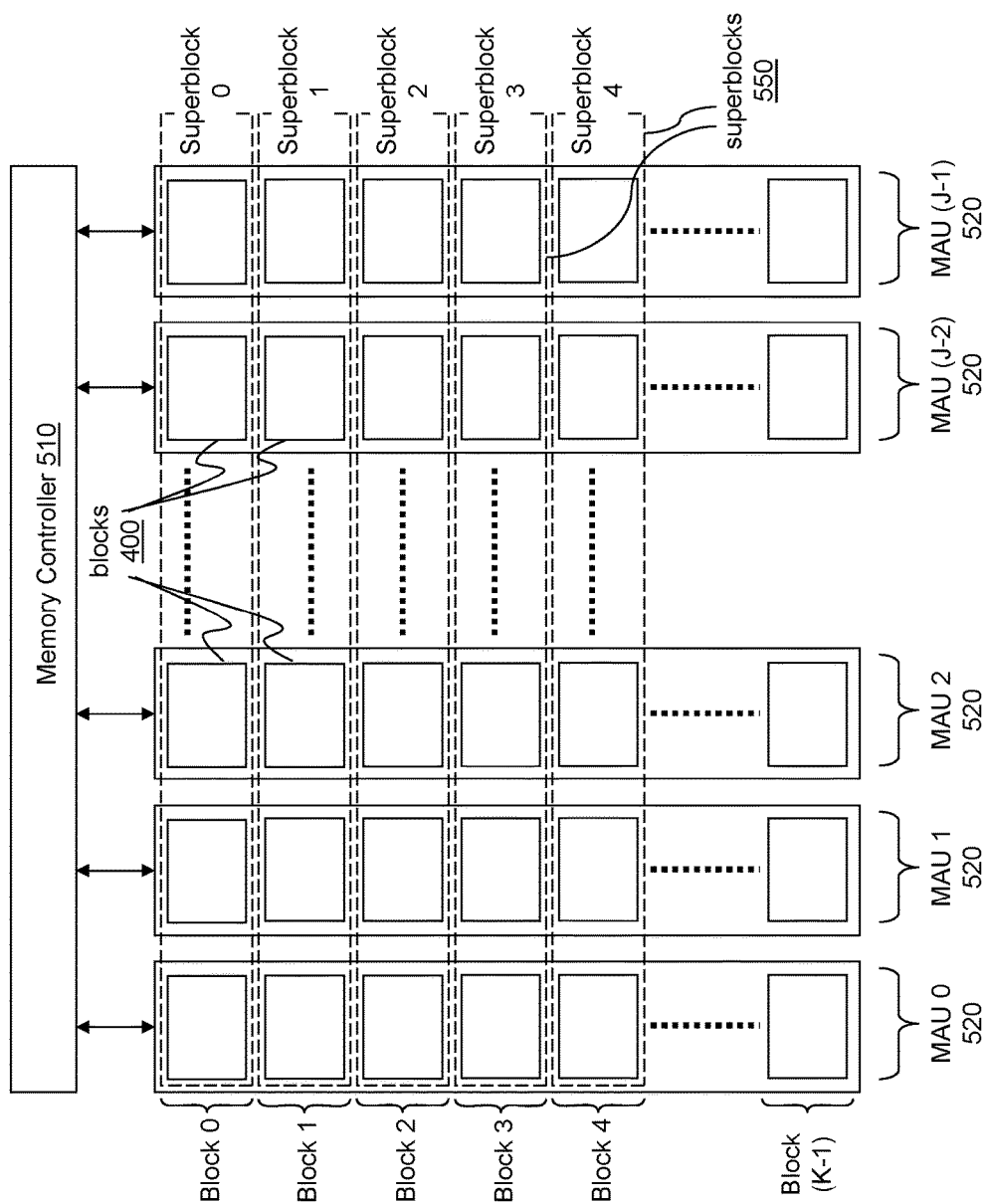
FIG. 2 schematically illustrates organization of superblocks within a memory channel for a case in which each memory cell within the memory access units is fully functional.

According to an aspect of the present disclosure, the memory controller 510 can organize the memory access units 520 within a same memory channel 600 into a set of superblocks 550. Referring to FIG. 2, organization of superblocks 550 within a memory channel 600 is schematically illustrated for a case in which each memory cell within the memory access units 520 is functional. Each superblock 550 includes a block (i.e., a smallest selectable unit for an erase operation) from each of the memory access units 520, and may include as many number of blocks as the total number of memory access units 520 within the memory channel. The memory controller 510 may have dedicated hardware components to enable organization of the memory access units 520 within a same memory channel 600 into a set of superblocks 550, and/or can be provided with software, i.e., a dedicated program, to enable the organization of the memory access units 520 into the set of superblocks 550.

As discussed above, each memory access units 520 within a memory channel 600 may include a single flash memory device such as a single integrated circuit (IC) die, a plurality of flash memory devices such as a plurality of IC dies, or a single plane within a single flash memory device, such as a single IC die, that contains multiple planes. An IC die can be a packaged semiconductor chip. For example, each memory access unit 520 can be a single plane of an IC die that contains two planes. Thus, each superblock 550 can include memory locations of a single block from multiple memory access units 520. The superblocks 550 provide operational parallelism, thereby enabling parallel execution of programming, reading, and erase operations on multiple blocks 400 located within different memory access units 520. Thus, each superblock 550 may belong to a particular bank, or may be a concurrently addressable unit ("CAU"). In an embodiment, the computer system 900 can access a superblock 550 by changing the state of a chip enable ("CE") signal.

In case all blocks 400 within a memory channel 600 are functional, each superblock 550 can include all blocks within the memory access units 520 that have the same position within the respective memory access unit 520, i.e., having the same "block number." For example, if each memory access unit 520 includes K blocks, the r-th block can have a block number of (r−1) in which r is an integer from 1 to K. For example, the first block can have a block number of 0, the second block can have a block number 1, and the K-th block can have a block number (K−1), etc. In this case, superblock 0 of the memory channel 600 can include block 0 of each of the memory access units 520, superblock 1 of the memory channel 600 can include block 1 of each of the memory access units 520, superblock 2 of the memory channel 600 can include block 2 of each of the memory access units 520, and so on.

A non-functional block, generated either at the time of manufacture or during operation, reduces the available total memory by rendering some of the superblocks 550 illustrated in FIG. 2 non-functional. In this case, each superblock 550 including at least one non-functional block can be removed from available memory. Since non-functionality of even a single page or a single word line zone is sufficient to render a block non-functional, non-functionality of a single page or a single word line zone can result in unavailability of a superblock 550 during operation in the scheme illustrated in FIG. 2 in case one imperfect block is present.

In this configuration illustrated in FIG. 2, if any of the blocks 400 includes a non-functional memory cell, page or word line zone, then such a block 400 can be excluded from construction of superblocks 550. In this case, any block including at least one non-functional cell, page or word line zone is merely skipped during construction of superblocks 550. Thus, whenever a block 400 with less than perfect functionality is encountered during construction of any superblock 550, such a block is skipped and a functional block 400 with the next lowest physical address can be selected from the same memory access unit 520 for the purpose of constructing the superblock 550. In other words, one good block 400 is picked from each memory access unit 520 to form each superblock 550. Each good block 400 is logically divided into multiple super word line zones including memory cells that are accessed by a respective group of super word lines, and each super word line zone in the superblock 550 is functional and is utilized during use of the superblock 550. If any super word line zone, page or even a single memory cell is not functional, then such a block is discarded during construction of the superblocks 550, and is not employed during operation of the memory channel 600.

According to an aspect of the present disclosure, a method of enhancing overall utilization of the overall memory is provided, which includes use of a block 400 that includes at least one non-functional page or super word line zone and at least one functional page or super word line zone. According to an aspect of the present disclosure, FIG. 3 shows a flow diagram for a method that can provide super word line zones 450 having a greater total memory capacity than the scheme employed in FIG. 2.

Figure 3:
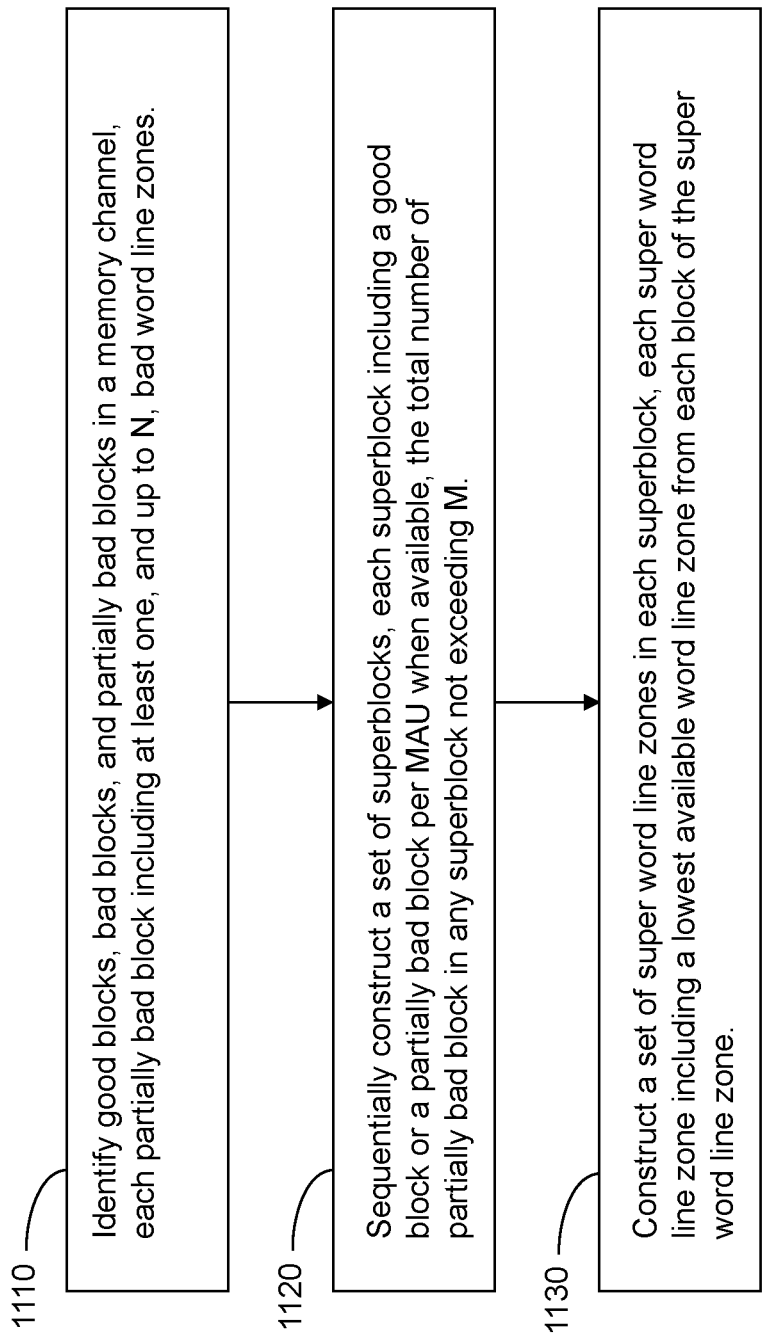
FIG. 3 is a flow diagram for a method that can provide super word line zones having a greater total memory capacity than the scheme employed in FIG. 2.
Figure 4:
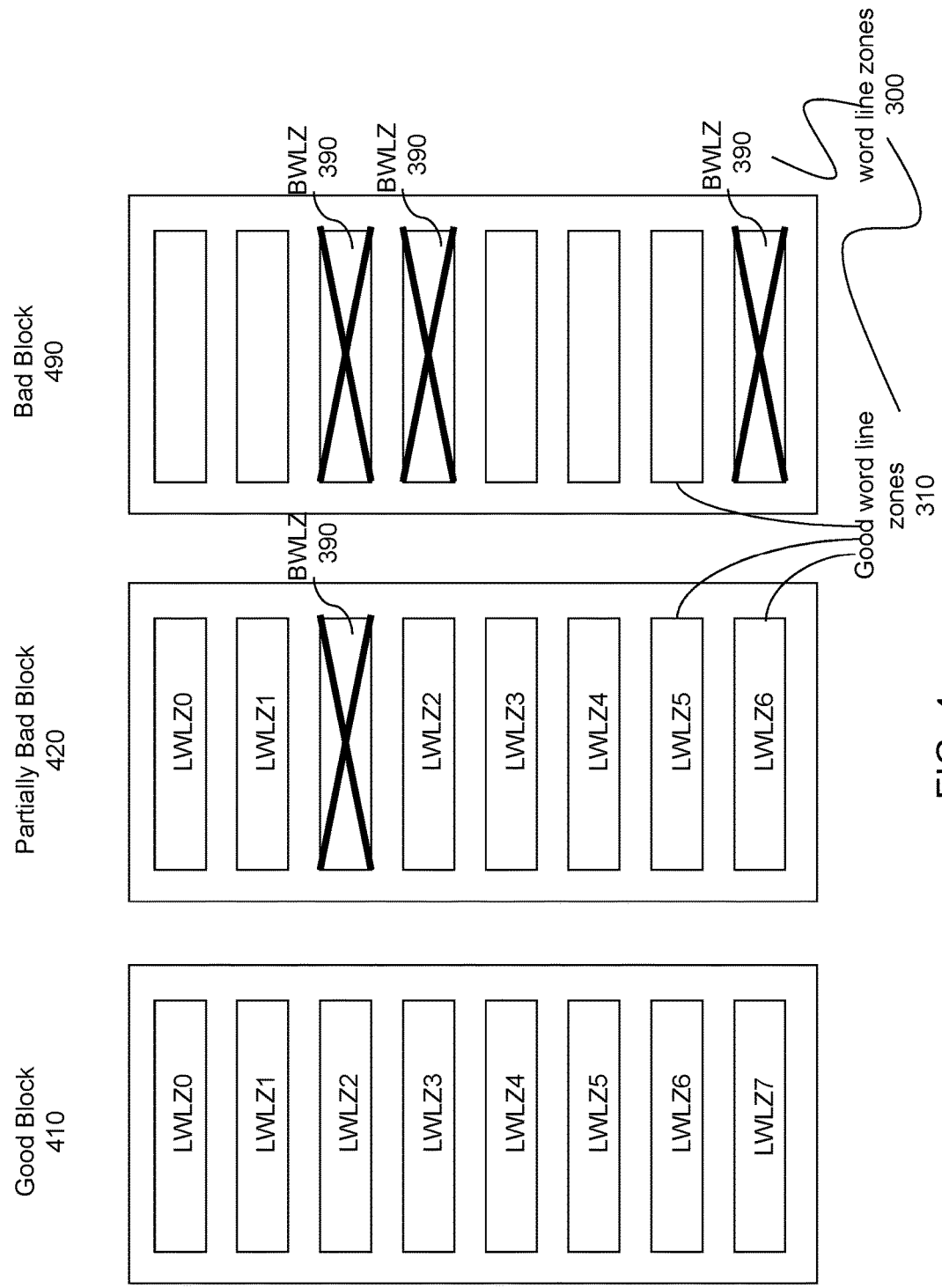
FIG. 4 illustrates three types of blocks, which include a good block, a partially bad block, and a bad block.

At step 1110 of FIG. 3, good blocks, bad blocks, and partially bad blocks in a memory channel are identified. Each partially bad block includes at least one, and up to N, bad word line zones. FIG. 4 illustrates a method of classifying blocks 400 in the memory access units 520 of a memory channel 600, which can be employed to perform step 1110 of FIG. 3.

FIG. 4 illustrates three types of blocks 400, which include a good block 410, a partially bad block 420, and a bad block 490. To implement step 1110 of FIG. 3, each block 400 can be partitioned into word line zones 300, each of which includes a set of memory cells accessed by one or more word lines. The word line zones in FIG. 4 are labeled "LWEZ" to indicate that they are logical word line zones rather than physical word line zones on the IC die. Each word line can access an entire set of memory cells within a single page. Thus, each word line zone 300 can include a plurality of pages within a block 400 that is less than the entire set of pages within the block 400. A plurality of word line zones 300 is present within each block. For example, each block 400 can include L word line zones 300. The number L can be in a range from 2 to 1,024, such as from 4 to 128, although more than 1,024 word lines zones 300 may be present per block 400. The number L is 8 in the example illustrated in FIG. 3. If each block 400 includes F number of pages, and if each block 400 includes L number of word line zones 300, each word line zone 300 can include F/L number of pages, such as 1-8 pages, which provides 64 to 256 pages per block 400.

According to an aspect of the present disclosure, each block 400 in the memory access units 520 of the memory channel 600 can be classified as a good block 410, a bad block 490, or a partially bad block 420. Specifically, a maximum number N of bad word lines zones 390 permitted within a partially bad block 420 is provided by the memory controller 510. If a tested block 400 includes L good word line zones 310 (i.e., L fully functional word line zones), the tested block 400 is classified as a good block 410. If the total number of bad word line zones (BWLZ) 390 (i.e., non-functional word line zones) within a tested block 400 is from 1 to N, the tested block 400 is classified as a partially bad block 420. If the tested block 400 includes (N+1) or more bad word line zones 390, the tested block 400 is classified as a bad block 490. The maximum number N of bad word lines zones 390 permitted within a partially bad block 420 can be in a range from 1 to (L−1), and is typically in a range from 1 to L/8, such as 1 to 2.

The data storage system of the present disclosure can provided with means for performing the step of classifying each block 400 within the plurality of memory access units 520 into good blocks 410, partially bad blocks 420, and bad blocks 490, wherein good blocks 410 include only good word line zones 310, each of the partially bad blocks 420 includes at least one, and not more than N, bad word line zones 390, and each of the bad blocks 490 includes more than N bad word line zones 390, wherein N is a positive integer. The means for performing the step of classifying each block 400 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of classifying each block 400 within the plurality of memory access units 520. Alternatively, if the memory controller 510 is omitted, then this function can be performed by the storage controller 700.

The maximum number N of bad word lines zones 390 permitted within a partially bad block 420 may be a hard-coded number implemented in the hardware of the memory controller 510 at the time of manufacturing, a programmable number that is implemented in the hardware of the memory controller 510 through external programming by the computer system 900 (for example, by a one-time programmable read only memory (OTPROM) or an erasable programmable read only memory (EPROM)), or operational data that is provided by the computer system 900 and stored within built-in memory of the memory controller 510. In one embodiment, the maximum number N can be determined at the time of manufacture of the memory controller 510.

According to an aspect of the present disclosure, each word line zone in a good block 410 or in a partially bad block 420 can be numbered. For example, the numbering of the logical word line zones 300 can proceed in the order of the physical address of the good word line zones 310, and skip over bad word line zones 390. For example, the logical word line zone number 0 can be assigned to the good word line zone 310 having the lowest physical address, the logical word line zone number 1 can be assigned to the good word line zone 310 having the next lowest physical address, and so on up to the logical word line zone number (L−1−i) in which L is the total number of word line zones 300 (whether good or bad) within each good block 410 or within each partially bad block 420, and i is the total number of bad word line zones 390 within the good block 410 (in which case i is zero) or within the partially bad block (in which case i is a positive integer not greater than N).

Referring to step 1120 of FIG. 3, a set of superblocks 550 can be sequentially generated employing the good blocks 410 and the partially bad blocks 420 identified at step 1110 of FIG. 3. In one embodiment, each superblock 550 can include a good block 410 or a partially bad block 420 per memory access unit 520 whenever available. The total number of partially bad blocks 420 in any superblock 550 is limited not exceed a predetermined limit M. The superblocks 550 can be generated from one with the lowest superblock number (such as 0) to the highest superblock number (which can be K−1 or an integer less than K−1).

Figure 5:
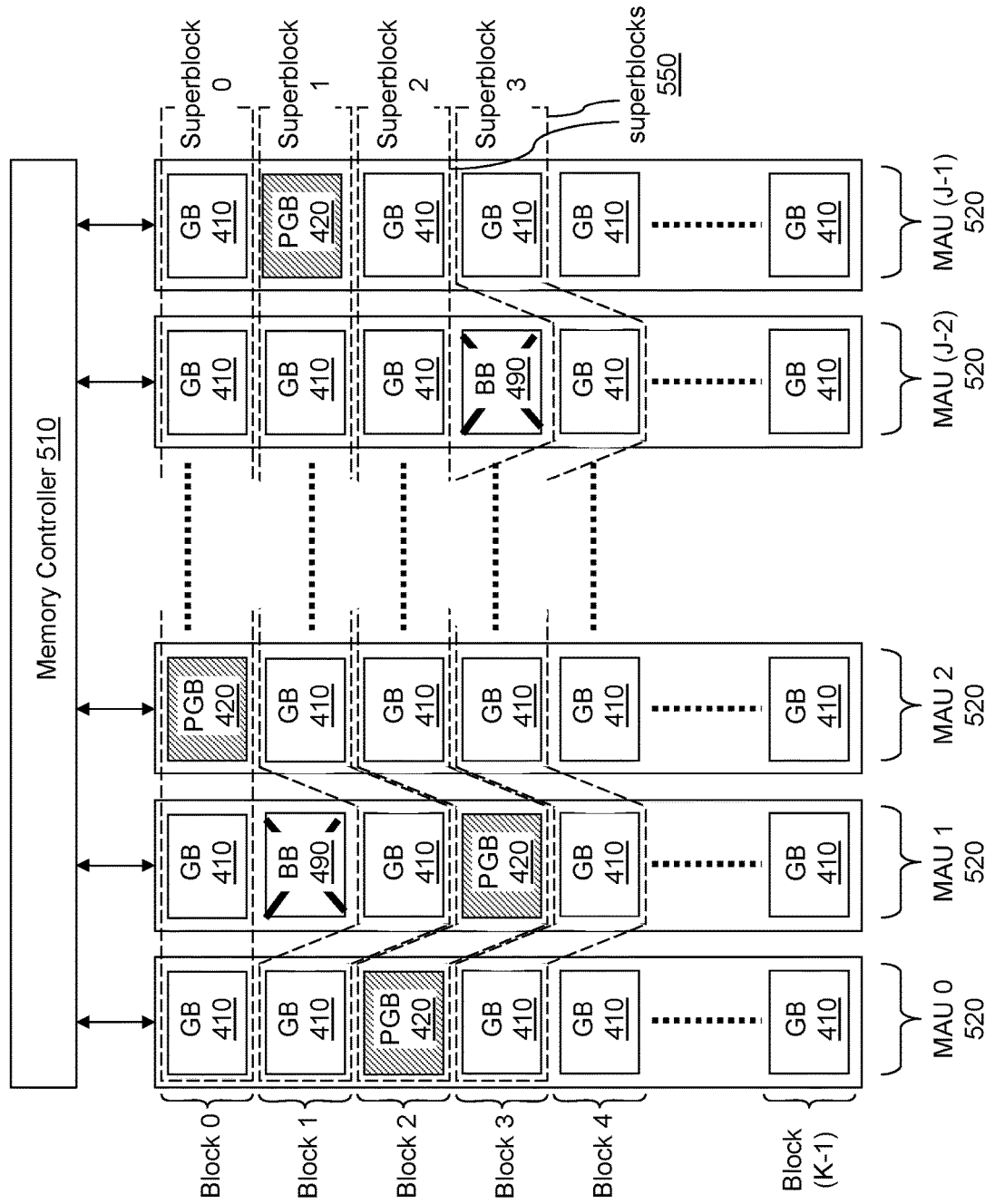
FIG. 5 illustrates an example of construction of superblocks from good blocks and partially bad blocks as identified at step 1110 of FIG. 4.

FIG. 5 illustrates an example of construction of superblocks 550 from good blocks 410 and partially bad blocks 420 as identified at step 1110 of FIG. 3, which is performed by the memory controller 510 within a memory channel 600 or by the storage controller 700. During construction of the superblocks 550, bad blocks 490 as identified at step 1110 of FIG. 3 can be excluded from construction of superblocks 550. In other words, any block including (N+1) or more bad word line zones 390 are excluded from construction of the superblocks 550. Beginning with the memory access units 520 having a lowest memory access unit number (which can run from 0 to (J−1) for a total of J memory access units 520 within a memory channel 600), one good block 410 or one partially bad block 420 is selected per memory access unit 520 whenever such a selection if possible for each memory access unit 520. For example, each memory access unit 520 may be a plane of an IC die containing two planes. In this example, each channel 600 may contain 32 IC die and 64 total memory access units 520, in which case each superblock 550 contains 64 blocks 400, and each block in the superblock 550 contains 8 word line zones, each of which contains 1 or more pages (e.g., 1 to 8 pages). A super page or super word line zone in this example includes one page or r super word line zone from each of the 64 blocks 400 of the superblock 550. Other suitable configurations may also be used.

For the first superblock 550 having a superblock number of 0 (i.e., the superblock labeled "superblock 0"), selection of one good block 410 or one partially bad block 420 per memory access unit 520 should be possible for each memory access unit 520 (unless one of the memory access units 520 happen to contain no good block 410 and no partially bad block 420, in which case such a memory access unit 520 is merely skipped). In an illustrative example, a good or partially bad block (410, 420) having the lowest physical address can be selected from each of the memory access units 520 to form the first superblock 550 having the superblock number of 0.

For any s-th superblock 550 having a superblock number of (s−1) in which s is an integer greater than 1 and not exceeding K (which the total number of blocks in any memory array unit 520), selection of one good block 410 or one partially bad block 420 that does not belong to a previously generated superblock 550 (i.e., selection of an available good or partially bad block (410, 420)) may be possible for each memory access unit 520 except for the memory access units 520 that ran out of good blocks 410 and partially bad block 420 during prior generation of superblocks 550 (which have lower superblock numbers. i.e., superblock numbers less than (s−1)). For example, an available (i.e., not incorporated into previously generated superblocks 550) good or partially bad block (410, 420) having the lowest physical address can be selected from within a set of all available good or partially bad blocks (410, 420) within each of the memory access units 520 to form the s-th superblock 550 having the superblock number of (s−1) as long as such a selection scheme can be implemented.

In case the index s approaches the total number K of the blocks within each memory access unit 520 and/or in case one of more of the memory access units 520 have a significant number of bad blocks, one or more of the memory access units 520 may run out of available good or partially bad blocks (410, 420). In this case, memory access units 520 that do not have any available good or partially bad blocks (410, 420) can be skipped, and the next good or partially bad block (410, 420) can be selected from the next memory access unit 520.

The data storage system of the present disclosure can include a memory controller 510 that controls operation of a plurality of memory access units 520. The data storage system of the present disclosure can provided with means for performing the step of constructing a set of superblocks 550 employing the good blocks 410 and the partially bad blocks 420, wherein each functional memory access unit 520 among the plurality of memory access units 520 contributes a single block (410, 420) that is a good block 410 or a partially bad block 420 to each superblock 550 within a predominant subset of the set of superblocks. As used herein, a "predominant subset" of a set refers to a subset of the set that includes more than 50% of all elements of the set. The means for performing the step of constructing the set of superblocks 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of constructing the set of superblocks 550.

Further, the data storage system of the present disclosure can provided with means for performing the step of constructing at least one superblock 550 (such as the last superblock formed employing less than J number of blocks (k−1) because some memory access units 520 used up all good or partially bad blocks (410, 420)) having a lesser number of blocks than a total number J of the functional memory access units among the plurality of memory access units 520 in case the functional memory access units 520 have different total numbers for good blocks and partially bad blocks therein. The means for performing the step of constructing such at least one superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of constructing such at least one superblock 550.

Available blocks with lowest block numbers, i.e., with lowest available physical addresses, can be employed during construction of each superblock 550. Thus, the data storage system of the present disclosure can provided with means for performing the step of sequentially generating each superblock 550 within the set of superblocks by grouping, within functional memory access units among the plurality of memory access units 520, each available good or partially bad block (410, 420) having a lowest available address within a respective functional memory access unit 520 that does not belong to any previously constructed superblock 550. The means for performing the step of sequentially generating each superblock 550 in this manner can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of sequentially generating each superblock 550 in this manner.

In one embodiment, a maximum number M can be imposed for the total number of partially bad blocks 420 that can be imposed in any superblock 550. In one embodiment, the maximum number M for the total number of partially bad blocks 420 within any superblock 550 can be 1, 2, 3, 4, or any number less than K, and is typically a number in a range between 1 and K/8. The purpose of imposing the maximum number M for the total number of partially bad blocks 420 is to maintain the quality of each superblock above a predetermined level of memory availability. The imposition of the maximum number M for the total number of partially bad blocks 420 can be implemented by several methods. In one illustrative example, a preliminary superblock can be generated by selecting only good blocks 410 having the lowest physical addresses among all available good blocks 410. If the preliminary superblock is missing a block from any memory access unit 520, that memory access unit 520 is searched to find an available partially bad block 420, which is subsequently added to the preliminary superblock. If a partially bad block 420 having a lower physical address than the selected good block 410 for the preliminary superblock is available within any of the memory access units 520, such a partially bad block 420 can replace the good block 410 to make the good block available for generation of a next preliminary superblock. Such processes can continue until no further addition or substitution of a partially bad block 420 is possible for the preliminary superblock, or until a total of M partially bad blocks 420 are incorporated into the preliminary superblock. At this point, the preliminary superblock is finalized as a superblock 550. Identification of the next preliminary superblock can follow until further generation of an additional superblock 550 is impossible. In one embodiment, each superblock 550 may have a limitation on the minimum total number of good or partially bad blocks (410, 420). In other words, each superblock 550 may include at least the minimum total number of good or partially bad blocks (410, 420).

In one embodiment, the data storage system of the present disclosure can provided with means for performing the step of limiting a total number of partially bad blocks 490 within each superblock 550 to a number that does not exceed a maximum number M for a total number of partially bad blocks 420 in any single superblock 550 during construction of the set of superblocks 550. The means for performing the step of limiting the total number of partially bad blocks 490 within each superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of limiting the total number of partially bad blocks 490 within each superblock 550.

In one embodiment, the data storage system of the present disclosure can provided with means for performing the step of generating a superblock table that lists physical addresses of partially bad blocks 420 within each superblock 550 and physical addresses of bad blocks 490 during construction of the set of superblocks 550. The means for performing the step of generating the superblock table can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of generating the superblock table.

Each superblock 550 can be organized to include a set of super word lines zones 450. Each super word line zone 450 in a superblock 550 may include a good word line zone 310 from each of the good or partially bad blocks (410, 420) within a respective superblock 550. A good word line zone 310 is a logical word line zone in which all memory cells or pages are functional. In contrast, a bad word line zone 390 (illustrated in FIGS. 7-9) is a word line zone in which not all of the memory cells or pages are functional. Thus, referring to step 1130 in FIG. 3, a set of super word line zones 450 in each superblock is constructed. Each super word line zone 450 may include a lowest available word line zone from each block of the super word line zone.

Referring back to FIG. 6, each super word line zone 450 and may include as many number of good word line zones 310 (e.g., good logical word line zones, LWLZs) as the total number of good or partially bad blocks (410, 420) within the super word line zone 450. The memory controller 510 may have dedicated hardware components to enable organization of the memory access units 520 within a same memory channel 600 into a set of superblocks 550 each containing a respective set of super word line zones 450, and/or can be provided with software, i.e., a dedicated program, to enable the organization of the memory access units 520 into the set of superblocks 550 each containing a respective set of super word line zones 450.

The super word line zones 450 can provide operational parallelism, thereby enabling parallel execution of programming, reading, and erase operations on multiple good word line zones 310 located within different memory access units 520 at a smaller memory size than superblocks 550. Thus, each super word line zone 450 may be a component of a particular bank, or may be a component of a concurrently addressable unit. In an embodiment, the computer system 900 can access a super word line zone 450 by changing the state of a chip enable signal.

According to an aspect of the present disclosure, the super word line zones 450 within a superblock 550 can be organized in various configurations as illustrated in FIGS. 6, 7, 8, and 10.

Figure 6:
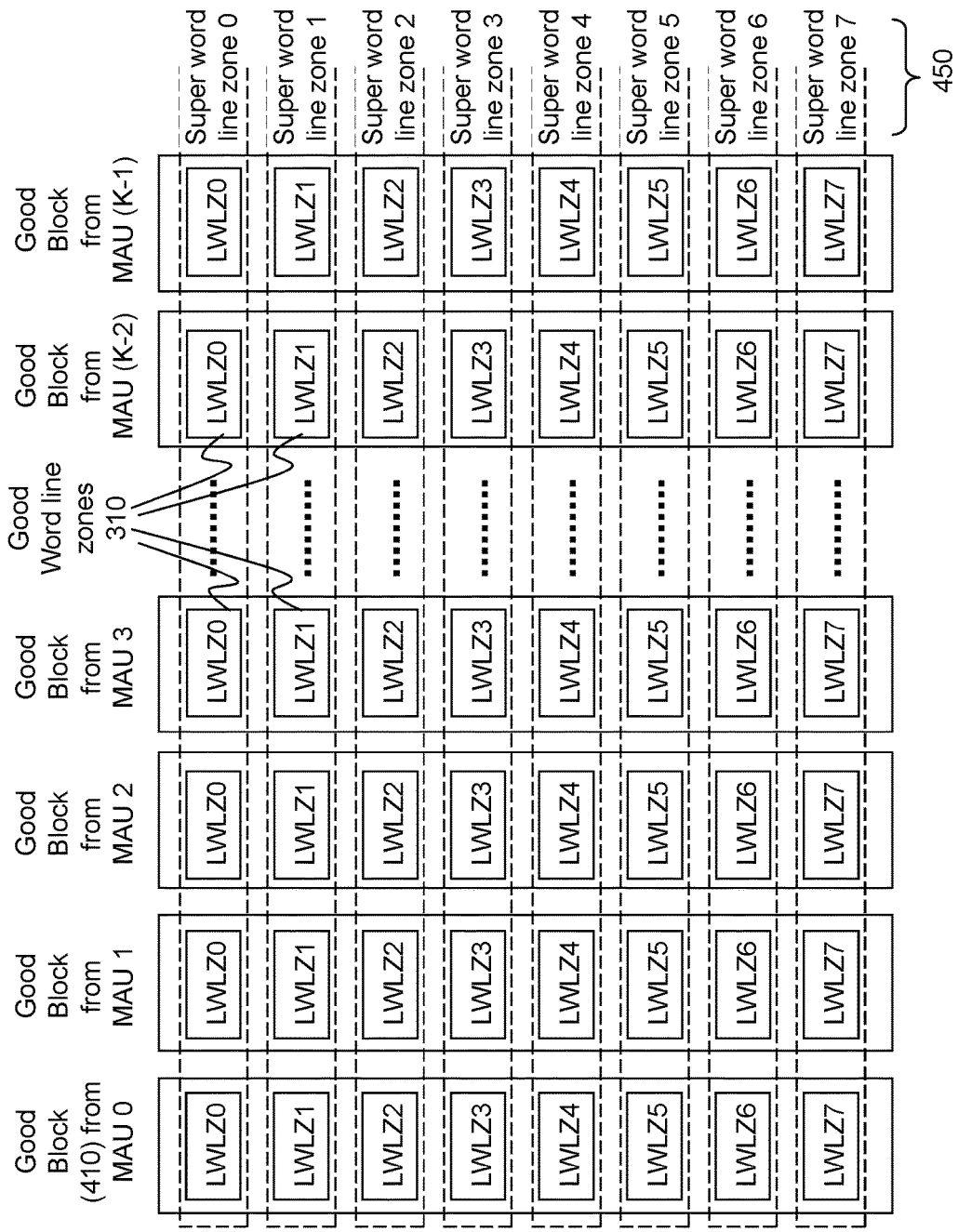
FIG. 6 illustrates a first exemplary organization of super word line zones within a superblock in case the superblock consists of good blocks.

FIG. 6 illustrates a first exemplary organization of super word line zones 450 within a superblock 550 in case the superblock 550 consists of only good blocks 410. For example, the superblock 550 of FIG. 6 can include J number of good blocks 410 in case each of the memory access units 520 contributes a respective good block 410 for construction of the superblock 550. Alternatively, one of more blocks corresponding to one or more memory access units 520 may be missing in the superblock 550, and the superblock 550 can include less than J number of good blocks 410.

If all blocks 400 within a superblock 550 are good blocks 410, each super word line zone can be generated by numbering each word line zone in each good block 410 sequentially, for example, starting with 0 and ending with (L−1). For example, each word line zone in each good block 410 can be sequentially sorted in the order of an increasing physical address, and can be assigned word line zone numbers starting with 0 and ending with (L−1). All word line zones with the same word line number can be collected across the good blocks 410 to generate a super word line zone 450. Each good block 410 can contribute a single good word line zone 310 to a respective super word line zone 450. For example, a first super word line zone labeled super word line zone 0 can include the set of all word line zones with the lowest physical address that are labeled as word line zone 0's, a t-th super word line zone labeled super word line zone (t−1) can include the set of all word line zones that include the next lowest physical address that are labeled as word line zone (t−1)'s for each integer t that is greater than 1 and not exceeding L.

Figure 7:
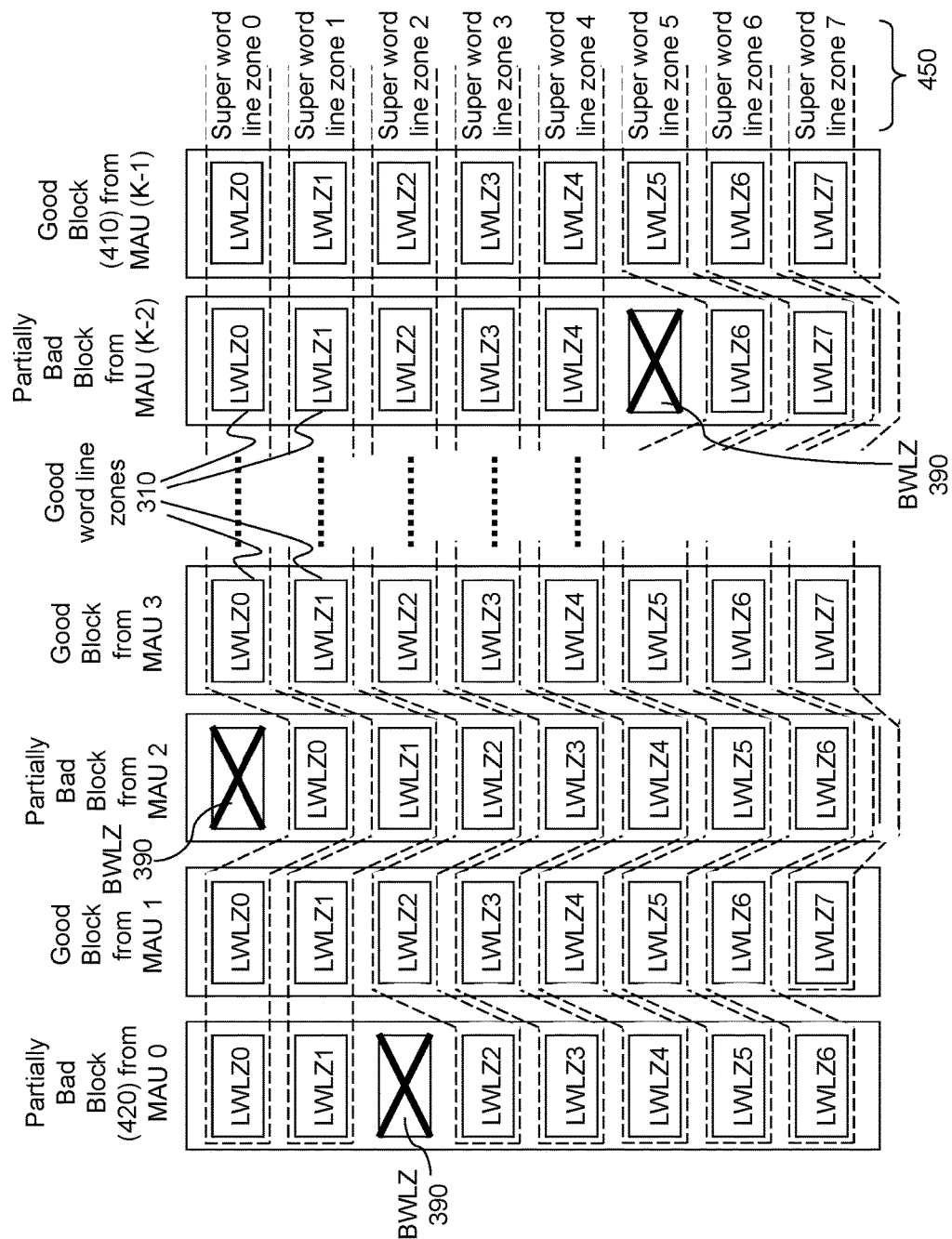
FIG. 7 illustrates a second exemplary organization of super word line zones within a superblock in case the superblock includes good blocks and partially bad blocks.
Figure 8:
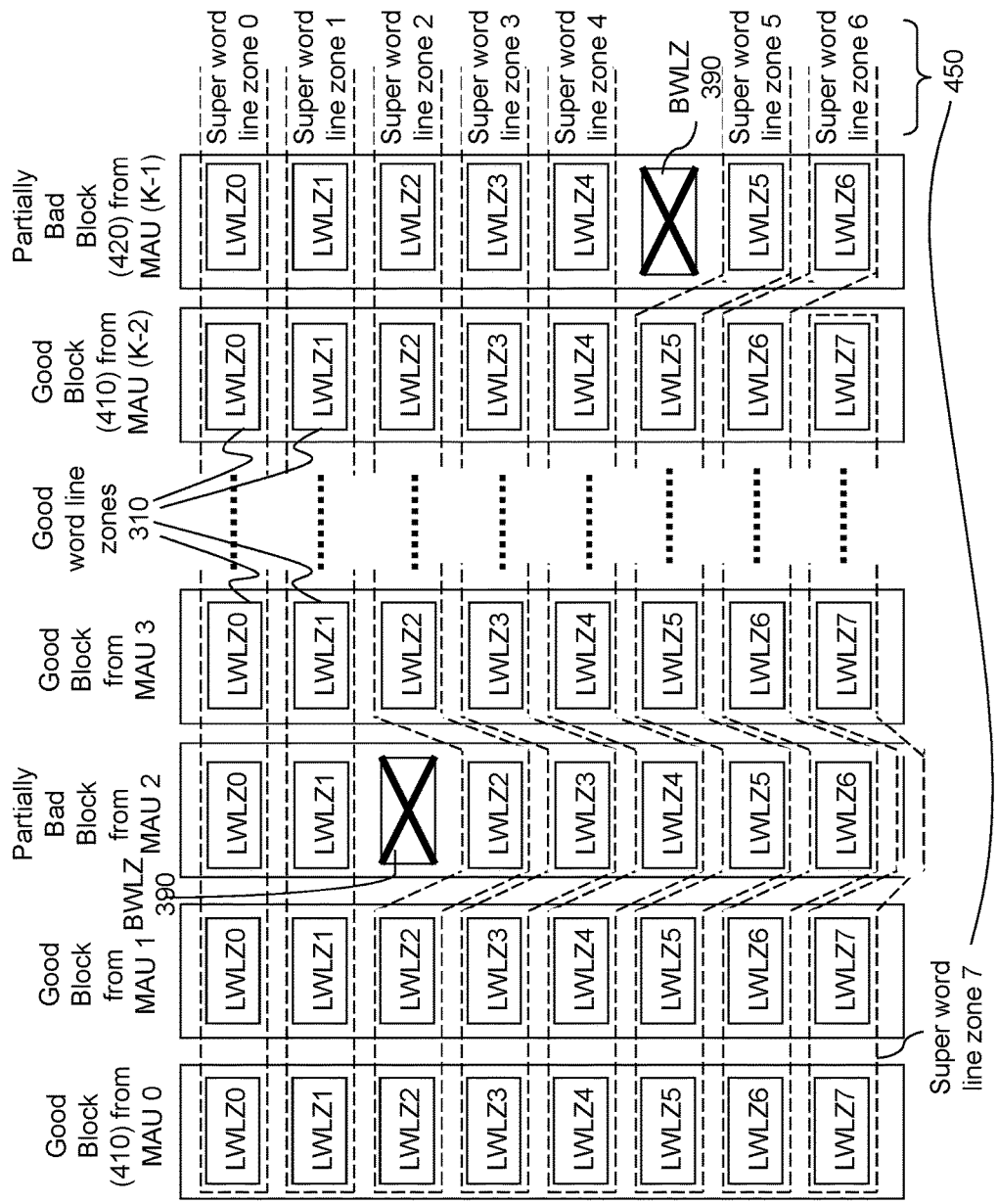
FIG. 8 illustrates a third exemplary organization of super word line zones within a superblock in case the superblock includes good blocks and partially bad blocks.
Figure 9:
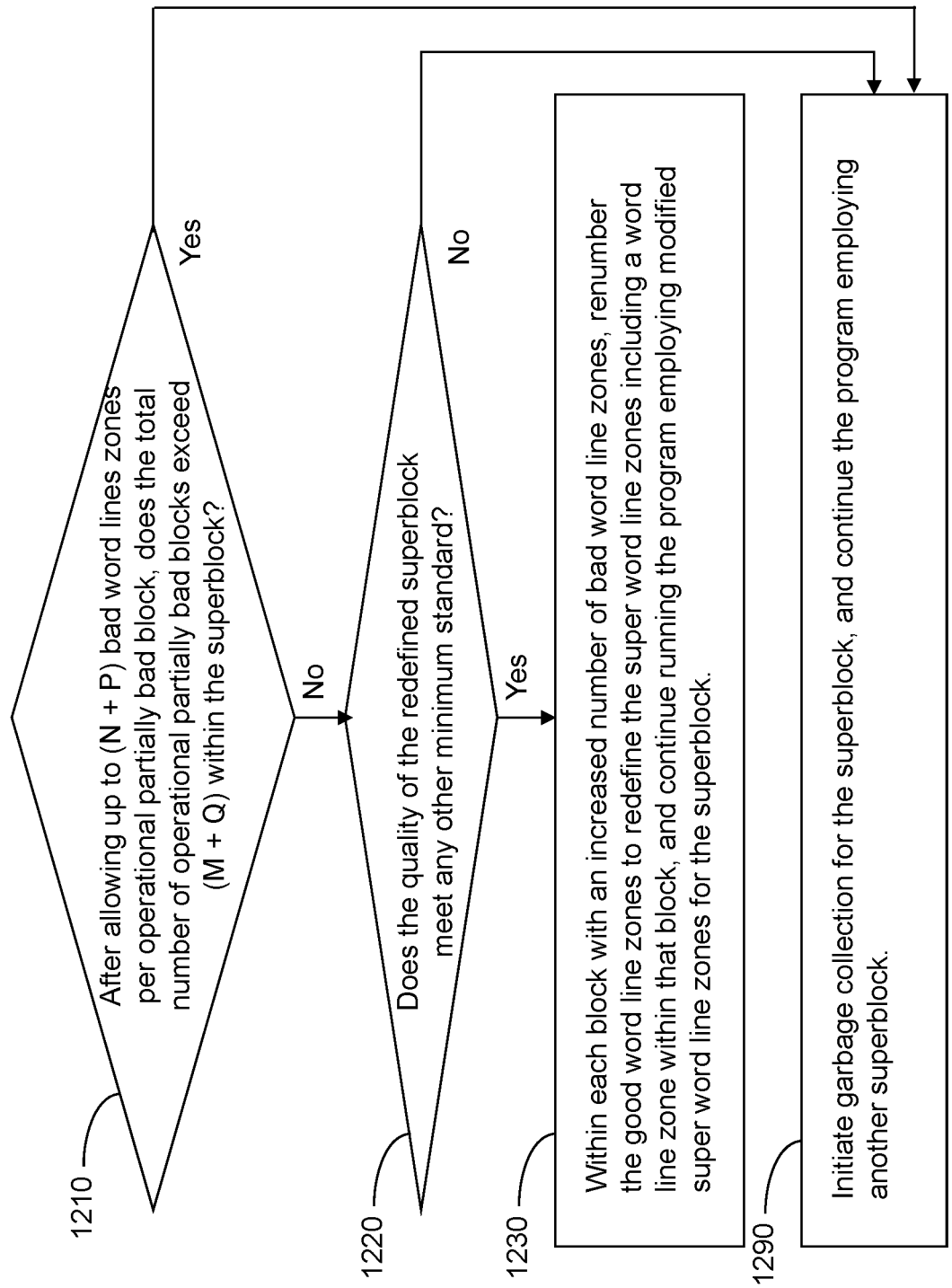
FIG. 9 is a flow diagram for the case of a program error is indicated at run time.

FIGS. 7 and 8 illustrate second and third exemplary organizations of logical super word line zones 450 within a superblock 550 in case the superblock 550 includes good blocks 410 and partially bad blocks 420 (of which the total number does not exceed M as discussed above). All physical word line zones (including good and bad physical word line zones) are shown from top to bottom in the order of increasing physical address for each block that is contained the superblock 550. As discussed above, up to N of bad word lines zones 390 are permitted within each partially bad block 420 during identification of partially bad blocks 420 by the memory controller 510. The values for M and N depend on the requirements of the data storage system 1000 or the memory channel 600. Physical word line zones that constitute a k-th super word line zone, i.e., "Super word line zone k," are labeled "WLZk," in which k is an index running from 0 to the number that is the total number of the super word line zones less one. The physical word line zones have fixed physical locations as schematically illustrated. Thus, physical locations of the bad word line zones BWLZ 390 are schematically illustrated by rectangles marked by "X." However, the bad word line zones BWLZ 390 are not included among the logical word line zones LWLZk or logical super word line zones 450. Further, while the present disclosure is described employing a simplest allocation of logical word line zones LWLZk, it is understood that any different functional physical word line zones can be assigned as the logical word line zones LWLZk. Such permutations among the logical assignment of the functional physical word line zones are expressly contemplated herein.

In a non-limiting example shown in FIG. 7, a partially bad block 420 is selected from memory access units (MAUs) with the memory access unit numbers 0, 2 and K−2 for construction of a superblock 550. Within each of the partially bad blocks 420, bad word line zones 390 (i.e., physical word line zones 0, 2 and 5, respectively) are skipped in sequential numbering of the logical word line zones. In another non-limiting example shown in FIG. 8, a partially bad block 420 is selected from memory access units (MAUs) with the memory access unit numbers 2 and K−2 for construction of a superblock 550. Within each of the partially bad blocks 420, bad word line zones 390 (i.e., physical word line zones 2 and 5, respectively) are skipped in sequential numbering of the logical word line zones. In other words, only the good word line zones 310 are employed in the numbering of the logical word line zones within each partially bad block 420. Since good blocks 410 do not contain any bad word line zones 390, all of the word line zones (each of which is a good word line zone 310) within each good block 410 can be sequentially numbered. The sequential numbering of the good word line zones 310 can be based on the physical address of the good word line zones 310. For example, within each partially bad block 420 and within each good block 410, the good word line zone 310 with the lowest physical address can be labeled as word line zone 0 (WLZ0), and the good word line 310 with the u-th lowest physical address can be labeled as word line zone (u−1) (WLZ(u−1)) for each integer u that does not exceed the total number of good word line zones 310 within the respective good or partially bad block (410, 420).

Thus, partially bad blocks 420 can be employed to construct a superblock 550. The good word line zones 310 in the partially bad blocks 420 can be employed in conjunction with the good word line zones 310 in good blocks 410 to form a group of (logical) good word line zones 310 that constitutes a (logical) super word line zone 450.

The data storage system of the present disclosure can provided with means for performing the step of constructing a set of super word line zones 450 within each superblock 550 in the set of superblocks, wherein each block (410, 420) within a superblock 550 contributes a good word line zone 310 to each super word line zone 450 within a predominant subset of the set of super word line zones 450. In other words, more than 50% of all super word line zones 450 can include K number of good word line zones 310. One or more of all super word lines zones 450 may include less than K number of good word line zones 310. The means for performing the step of constructing the set of super word line zones 450 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of constructing the set of super word line zones 450.

The data storage system of the present disclosure can provided with means for performing the step of sequentially generating each super word line zone 450 within each superblock 550 by grouping, within each block (410, 420) within the superblock 550, each available good word line zone 310 having a lowest available address within a respective block (410, 420) that does not belong to any previously constructed super word line zone 450. The means for performing the step of sequentially generating each super word line zone 450 within each superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of sequentially generating each super word line zone 450 within each superblock 550.

The memory controller 510 can be configured to record which blocks 400 are employed in each superblock 550 to keep track of the organization of the superblocks 550. In other words, the physical addresses of the blocks 400 within each superblock 550 are tabulated to keep record of the organization of each superblock 550. In addition, the memory controller 510 can be configured to record the list, and physical addresses, of partially bad blocks 420 within each superblock 550. Further, the memory controller 510 can be configured to record the list, and physical addresses, of bad word line zones 390 (which changes the numbering of numbered good word line zones 310 that are incorporated into a respective super word line zone 450) for each partially bad block 420.

The data storage system of the present disclosure can provided with means for performing the step of generating a super word line zone table that lists physical addresses of word line zones within each super word line zone during construction of the set of super word line zones. The means for performing the step of generating the super word line zone table can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of generating the super word line zone table.

In one embodiment, as many full size super word line zones 450 as possible are populated within each superblock 550. Each full size word line zone 450 has the same number of good word line zones 310 as the total number of good or partially bad blocks (410, 420) within the respective superblock 550. Non-full size super word line zones (such as super word line zone 7 in FIGS. 7 and 8) can be subsequently generated. Each non-full size super word line zone has a lesser number of good word line zones 310 than the total number of good or partially bad blocks (410, 420). In one embodiment, the non-full size super word line zones can be utilized in addition to the full size super word line zones within a respective superblock 550 to store data. In another embodiment, the non-full size super word line zones may be employed as spare memory during operation of the respective superblock 550.

During logical to physical translation of the memory, superblocks 550 with at least one partially bad block 420 can be accounted for by keeping registry of the list of the partial bad blocks 420 and the list of the bad word line zones 390.

According to another aspect of the present disclosure, a method is provided for continuing to use super word line zones 450 with a modification even after encountering a program error in one of the word line zones (which was previously classified as a good word line zone 310 prior to occurrence of the error) of the super word line zones 450.

The data storage system of the present disclosure can provided with means for performing the step of determining whether to modify super word line zones 450 within a superblock 550 or to initiate garbage collection upon encounter of a program error at the superblock 550. The means for performing the step of determining whether to modify super word line zones 450 within a superblock 550 or to initiate garbage collection upon encounter of a program error at the superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of determining whether to modify super word line zones 450 within a superblock 550 or to initiate garbage collection upon encounter of a program error at the superblock 550.

Figure 10:
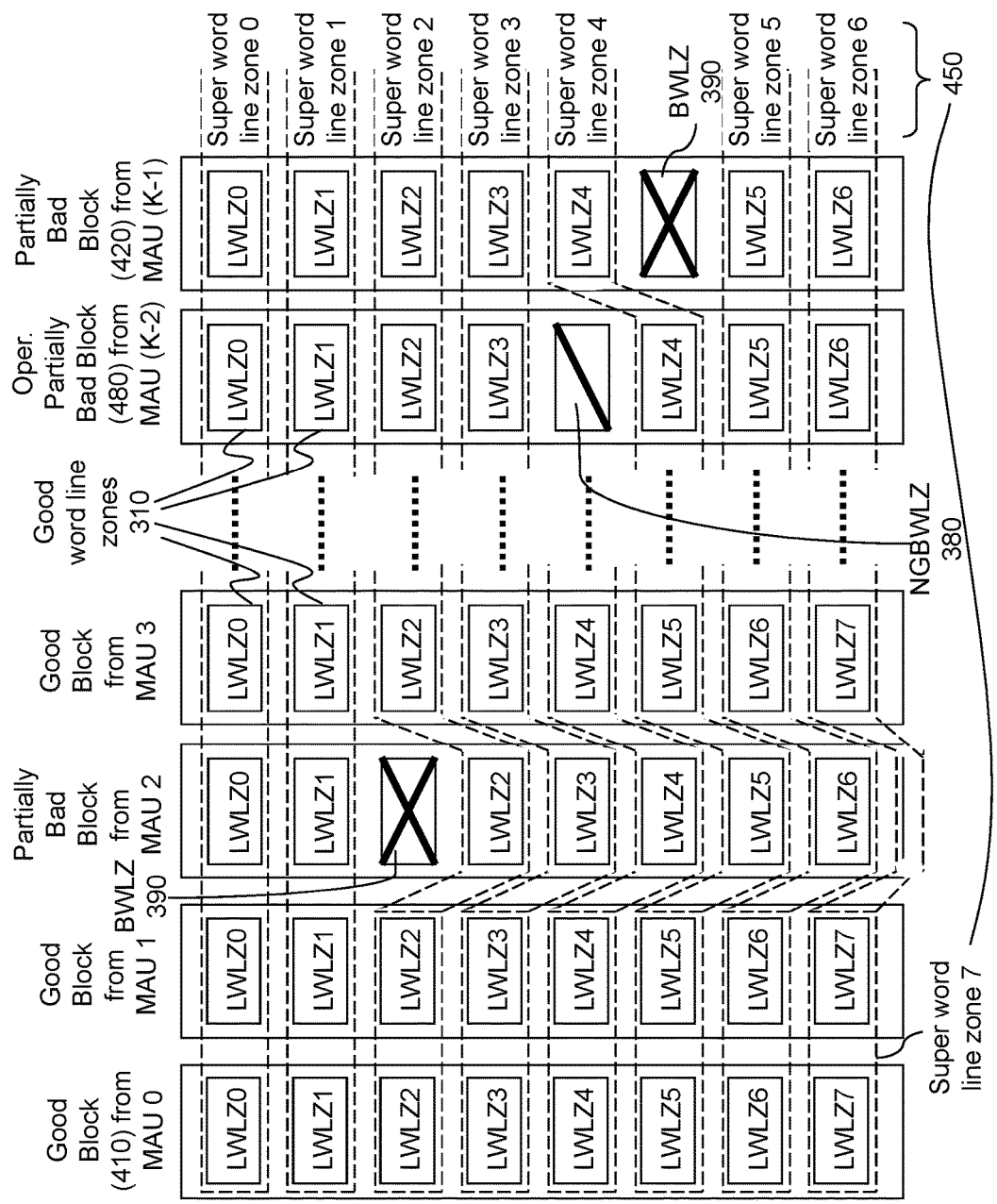
FIG. 10 illustrates a fourth exemplary organizations of super word line zones within the superblock.

In one embodiment, the steps of FIGS. 3 to 7 can be performed after manufacture but before the use of the storage device 800. In another embodiment shown in FIG. 9, a flow diagram for the case of a program error at run time is indicated during the use of the storage device 800. In this case, one or more newly generated bad word line zone (NGBWLZ) 380 shown in FIG. 10 is detected after the program error. NGBWLZ 380 may be a bad word line zone generated or first detected during the use (e.g., programming, erasing and/or reading) of the storage device 800. Furthermore, an "operational partially bad block" is defined as any block having at least one, and not more than (N+P), bad word lines as measured after the programming error. At step 1210, the memory controller 510 examines the superblock 550 that generates the program error to determine how many operational partially bad blocks are present. In this case, the non-negative integer P is a first memory operation parameter that is stored in the memory controller 510, either by hard coding by hardware at the time of manufacture of the memory controller 510, or by data received from the computer system 900 or from the storage controller 700. In one embodiment, the non-negative integer P can be a positive integer such as 1, 2, 3, 4, etc. In one embodiment, the positive integer can be less than L/8. In another embodiment, the non-negative integer P can be zero. The first memory operational parameter P represents how many additional failed word line zones over the number N (the original maximum number for failed word line zones in a memory block for use as a partially bad block 420) will be tolerated within each operational partially bad block (i.e., after the operation of the storage device 800 is initiated), which is counted as a usable block in the superblock 550.

The memory controller 510 counts the total number of operational partially bad blocks within the superblock 550. The memory controller 510 determines whether the total number of operational partially bad blocks exceeds (M+Q) within the superblock 550. If the total number of operational partially bad block exceeds the number (M+Q), then the process flow proceeds to step 1290, in which the superblock 550 is deemed to be unusable even after allowable modification, and garbage collection is initiated from the superblock 550, and the program can continue employing another superblock 550. In this case, the non-negative integer Q is a second memory operation parameter that is stored in the memory controller 510, either by hard coding by hardware at the time of manufacture of the memory controller 510, or by data received from the computer system 900 or from the storage controller 700. In one embodiment, the non-negative integer Q can be a positive integer such as 1, 2, 3, 4, etc. In one embodiment, the positive integer can be less than K/8. In another embodiment, the non-negative integer Q can be zero. The second memory operational parameter Q represents how many additional operational partially bad blocks over the number M (the original maximum number for partially bad block 420 for use in the superblock 550) will be tolerated within the superblock 550.

The data storage system of the present disclosure can provided with means for performing the step of performing, upon encounter of a program error during execution of a program at the superblock, a set of steps including a first step of determining a total number of operational partially bad blocks that have at least one, and not more than (N+P), bad word line zones within the superblock, wherein P is a first non-negative integer, and a second step of determining whether the total number of operational partially bad blocks exceeds M+Q, wherein M is a maximum number M for a total number of partially bad blocks in any single superblock during construction of the set of superblocks, and Q is a second non-negative integer. The means for performing the step of performing the set of steps upon encounter of a program error during execution of a program at the superblock can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the set of steps upon encounter of a program error during execution of a program at the superblock.

The data storage system of the present disclosure can provided with means for performing the step of proceeding with modification of the super word line zones 450 within the superblock 550 only when a set of conditions is met, wherein the set of conditions comprises a condition that the total number of operational partially bad blocks that have at least one, and not more than (N+P), bad word line zones (380, 390) within the superblock 550 does not exceed M+Q. In one embodiment, at least one of P and Q is a positive integer. The means for performing the conditional step of proceeding with modification of the super word line zones 450 within the superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the conditional step of proceeding with modification of the super word line zones 450 within the superblock 550.

The data storage system of the present disclosure can provided with means for performing the step of proceeding with garbage collection when the total number of operational partially bad blocks that have at least one, and not more than (N+P), bad word line zones within the superblock 550 exceeds M+Q. In one embodiment, at least one of P and Q is a positive integer. The means for performing the conditional step of proceeding with garbage collection can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the conditional step of proceeding with garbage collection.

If the total number of operational partially bad blocks does not exceed the number (M+Q), then the process flow can proceed to an optional step 1220, or to step 1230 in case the optional step 1220 is not present. At step 1220, the quality of superblock 550 may be examined. For example, the total number of good blocks 410 in the superblock 550 can be counted after the program error to determine whether the superblock 550 still includes a minimum number of good blocks. The minimum number of good blocks 410 in the superblock 550 may be less than K−(M+Q). If the minimum number of good blocks 410 in the superblock 550 is set to be the same as K−(M+Q), the superblock 550 will always pass the test at step 1220, and thus, step 1220 may be omitted. Step 1220 can thus control the quality of the superblock 550 after the program error. If the total number of good blocks 410 in the superblock 550 after the program error is less than the required minimum number of good blocks 410, then the process flow can proceed to step 1290.

If the total number of good blocks 410 in the superblock 550 after the program error is at, or is greater than, the required minimum number of good blocks 410, or if step 1220 is not present, the process flow can proceed to step 1230.

At step 1230, within each operational partially bad block having an increased count for any bad word line zone, the good word line zones 310 can be renumbered to redefine the super word line zones 450 including that block. The operational partially bad blocks can include bad word line zones 390 as determined at the time of generation of the superblocks 550, and can further include newly generated bad word line zones (NGBWLZ) 380 that are detected after the program error.

The data storage system of the present disclosure can provided with means for performing a set of steps during and after modification of the super word line zones 450 within the superblock 550. The set of steps can include a first step of renumbering, within each block 420 with an increased count for any bad word line zone (380, 390) after the program error, each good word line zones 310 (of which there is a decreased number due to formation of the newly generated bad word line zones (NGBWLZ) 380); a second step of redefining a subset of the super word line zones 450 within the superblock 550; and a third step of continuing to run, i.e., resuming, the program employing modified super word line zones 450 for the superblock 550. The means for performing the step of set of steps during and after modification of the super word line zones 450 within the superblock 550 can be dedicated hardware in the memory controller 510, software residing in the memory controller 510 and executed at the time of performing the step of classifying each block 400, or a combination of hardware of the memory controller 510 and software residing in the memory controller 510. Alternatively, if the memory controller 510 is omitted, then this function can be performed by the storage controller 700. Thus, the memory controller 510 or the storage controller 700 can be configured to perform the step of set of steps during and after modification of the super word line zones 450 within the superblock 550.

Referring to FIG. 10, a fourth exemplary organizations of super word line zones 450 within the superblock 550 is illustrated. The superblock 550 may be originally generated in the configuration of the third exemplary organization illustrated in FIG. 8. After encountering a programming error in the fifth word line zone of a good block 410 (as originally classified by the memory controller 510 at the time of generation of the superblock 550) within the (K−2)-th memory access unit (MAU) 520, the super word line zones 450 are modified in the manner described above. Specifically, the good block 410 including the newly generated bad word line zone 380 becomes an operational partially bad block 480 that includes a single bad word line zone (e.g., NGBWLZ 380), and thus, includes not more than (N+P) bad word line zones. Further, the total number of operational partially bad blocks within the superblock 550 increases by 1 from the total number of partially bad blocks employed at the time of generation of the superblock 550. If the total number of operational partially bad blocks within the superblock 550 does not exceed (M+Q), then the criteria of step 1210 are met. Thus, the memory controller 510 determines that the partially bad block from the memory access unit (K−2) is still usable as an operational partially bad block at step 1210 of FIG. 9.

Thus, the super word line zones 4, 5 and 6 of FIG. 10 are modified from the super word line zones 4, 5 and 6 of FIG. 8. Referring back to step 1230 of FIG. 9, the computer system 900 can continue running the program employing modified super word line zones 450 for the superblock 550. Thus, despite the program error, the superblock 550 that generated the program error can be saved by modifying the super word line zones therein. It is noted that the fifth word line zone of a selected block in the (K−2)-th memory access unit is employed merely for illustrative purposes, and that a programming error may occur at any of the good word line zones 310 as defined in FIG. 8. The fifth word line zone of the selected good block 410 of the (K−2)-th memory access unit was a good word line zone 310 in the original configuration provided prior to execution of the program as illustrated in FIG. 8, and was identified as such until the programming error occurred. Upon occurrence of the programming error, the partially bad block containing the location of the programming error is examined The advantage of the embodiments of the present disclosure include the ability to dynamically adjust the super word line zones during operation of the superblocks 550 without discarding the superblocks 550 in case of a program error. This ability can improve the quality of service (QoS) time, and reduce write amplification, thereby enhancing the speed and efficiency of program execution. In an illustrative example, the ability to dynamically adjust the super word line zones enables avoiding garbage collection in case a program error is encountered while writing to a parity page, whereas an error while writing to a parity page in prior art operational methods results in garbage collection in order to find good two parity pages in a superblock.

During the dynamic adjustment of the super word line zones performed at step 1230, addresses for the changed word line zones in the adjusted super word line zones are changed during execution of the program upon encounter of a program error, and the program can resume execution. The memory controller 510 can be configured to generate a super word line zone (SWLZ) table, for example, by hard coding by hardware at the time of manufacture. During the dynamic adjustment of the super word line zones, the content of the SWLZ table is adjusted if a program error is encountered during the operation of the memory channel 600. By avoiding garbage collection of the entire data stored in the superblock 550 before resuming usage of the current superblock, the quality of service time and write amplification can be reduced.

According to another aspect of the present disclosure, use of the partially bad blocks can improve capacity usage because more memory cells in the memory access units can be utilized during execution of a program, and thus, overall performance of the program can be improved. In other word, utilization of partially bad blocks can improve memory utilization.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A data storage system comprising a memory controller that controls operation of a plurality of memory access units, wherein the memory controller is configured to perform steps of:
   classifying each block within the plurality of memory access units into good blocks, partially bad blocks, and bad blocks, wherein the good blocks include only good word line zones, each of the partially bad blocks includes at least one, and not more than N, bad word line zones, and each of the bad blocks including more than N bad word line zones, wherein N is a positive integer; and
   constructing a set of superblocks employing the good blocks and the partially bad blocks, wherein:
      the memory controller is configured to construct a set of super word line zones within each superblock in the set of superblocks, wherein each block within the superblock contributes a good word line zone to each super word line zone within a predominant subset of the set of super word line zones;
      the memory controller is configured to determine whether to modify super word line zones within the superblock or to initiate garbage collection upon encounter of a program error at the superblock; and
      upon encounter of the program error during execution of a program at the superblock, the memory controller is configured to:
         determine a total number of operational partially bad blocks that have at least one, and not more than (N+P), bad word line zones within the superblock, wherein P is a first non-negative integer; and
         determine whether the total number of operational partially bad blocks exceeds M+Q, wherein M is a maximum number M for a total number of partially bad blocks in any single superblock during construction of the set of superblocks, and Q is a second non-negative integer, and
   wherein each of the plurality of memory access units comprises a single NAND or NOR flash memory integrated circuit die, a plurality of NAND or NOR flash memory integrated circuit dies, or a plane of a NAND or NOR flash memory integrated circuit die containing multiple planes.

2. The data storage system of claim 1, wherein:
   the memory controller is configured to proceed with modification of the super word line zones within the superblock only when a set of conditions is met, wherein the set of conditions comprises a condition that the total number of operational partially bad blocks that have one to (N+P) bad word line zones within the superblock does not exceed M+Q; and
   during and after modification of the super word line zones within the superblock, the memory controller is configured:
      to renumber, within each block with an increased count for any bad word line zone after the program error, each good word line zones;
      to redefine a subset of the super word line zones within the superblock; and
      to continue running the program employing modified super word line zones for the superblock.

3. The data storage system of claim 1, wherein:
the memory controller is configured to proceed with garbage collection when the total number of operational partially bad blocks that have one to (N+P) bad word line zones within the superblock exceeds M+Q; and
at least one of P and Q is a positive integer.

4. A method of operating a data storage system comprising a memory controller that controls operation of a plurality of memory access units, wherein each of the plurality of memory access units comprises a single NAND or NOR flash memory integrated circuit die, a plurality of NAND or NOR flash memory integrated circuit dies, or a plane of a NAND or NOR flash memory integrated circuit die containing multiple planes, the method comprising steps of:
classifying, by employing the memory controller, each block within the plurality of memory access units into good blocks, partially bad blocks, and bad blocks, wherein good blocks include only good word line zones, each of the partially bad blocks includes at least one, and not more than N, bad word line zones, and each of the bad blocks including more than N bad word line zones, wherein N is a positive integer;
constructing, by employing the memory controller, a set of superblocks employing the good blocks and the partially bad blocks;
constructing, by employing the memory controller, a set of super word line zones within each superblock in the set of superblocks, wherein each block within the superblock contributes a good word line zone to each super word line zone within a predominant subset of the set of super word line zones;
determining, by employing the memory controller, whether to modify super word line zones within the superblock or to initiate garbage collection upon encounter of a program error at the superblock; and
performing, upon encounter of the program error during execution of a program at the superblock, a set of steps comprising:
a first step of determining, by employing the memory controller, a total number of operational partially bad blocks that have at least one, and not more than (N+P), bad word line zones within the superblock, wherein P is a first non-negative integer; and
a second step of determining, by employing the memory controller, whether the total number of operational partially bad blocks exceeds M+Q, wherein M is a maximum number M for a total number of partially bad blocks in any single superblock during construction of the set of superblocks, and Q is a second non-negative integer.

5. The method of claim 4, further comprising:
proceeding, by employing the memory controller, with modification of the super word line zones within the superblock only when a set of conditions is met, wherein the set of conditions comprises a condition that the total number of operational partially bad blocks that have one to (N+P) bad word line zones within the superblock does not exceed M+Q; and
performing, during and after modification of the super word line zones within the superblock, by employing the memory controller a set of steps including:
a first step of renumbering, within each block with an increased count for any bad word line zone after the program error, each good word line zones;
a second step of redefining a subset of the super word line zones within the superblock; and
a third step of continuing to run the program employing modified super word line zones for the superblock.

* * * * *